United States Patent
Kuroda (10) Patent No.: US 8,138,266 B2
(45) Date of Patent: Mar. 20, 2012

(54) SEMICONDUCTOR-ENCAPSULATING RESIN COMPOSITION AND SEMICONDUCTOR DEVICE

(75) Inventor: Hirofumi Kuroda, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 793 days.

(21) Appl. No.: 12/053,455

(22) Filed: Mar. 21, 2008

(65) Prior Publication Data

US 2008/0246008 A1    Oct. 9, 2008

(30) Foreign Application Priority Data

Mar. 23, 2007 (JP) ................. 2007-076051
Mar. 23, 2007 (JP) ................. 2007-076052

(51) Int. Cl.
*C08F 8/00* (2006.01)
(52) U.S. Cl. ........................................ 525/109
(58) Field of Classification Search .......... 252/510; 525/109
See application file for complete search history.

(56) References Cited

U.S. PATENT DOCUMENTS

| | | | |
|---|---|---|---|
| 2003/0009001 A1* | 1/2003 | Akatsuka et al. | 528/86 |
| 2005/0208307 A1* | 9/2005 | Nikaido et al. | 428/413 |
| 2005/0267237 A1* | 12/2005 | Kuroda | 523/443 |
| 2008/0097010 A1 | 4/2008 | Kuroda | |
| 2009/0062430 A1* | 3/2009 | Ikezawa et al. | 523/400 |

FOREIGN PATENT DOCUMENTS

| | | |
|---|---|---|
| JP | 7-130919 | 5/1995 |
| JP | 8-20673 | 1/1996 |
| JP | 11-140277 | 5/1999 |
| JP | 2005-015559 | 1/2005 |
| JP | 2005-075869 | 3/2005 |
| JP | 2005-105087 | 4/2005 |
| JP | 2005-225971 | 8/2005 |
| JP | 2007-204722 | 8/2007 |
| WO | WO 2005/116104 | 12/2005 |
| WO | WO 2006/009147 | 1/2006 |
| WO | WO 2007/069525 | 6/2007 |

\* cited by examiner

*Primary Examiner* — Mark Eashoo
*Assistant Examiner* — Megan McCulley
(74) *Attorney, Agent, or Firm* — Ditthavong Mori & Steiner, P.C.

(57) ABSTRACT

A semiconductor-encapsulating resin composition includes a curing agent and a compound (A) having a plurality of glycidyl ether groups. When ion viscosity of the resin composition is measured under conditions of a measurement temperature of about 175° C. and a measurement frequency of about 100 Hz, minimum ion viscosity appears at about 5 seconds or later and within about 40 seconds from a measurement starting point. The minimum ion viscosity is at least about 4.0 and at most about 7.0. A maximum slope of the ion viscosity appears at about 10 seconds or later and within about 60 seconds from the measurement starting point. The maximum slope is at least about 2.0 and at most about 6.0.

19 Claims, 2 Drawing Sheets

SEMICONDUCTOR-ENCAPSULATING RESIN COMPOSITION AND SEMICONDUCTOR DEVICE

CROSS-REFERENCE TO RELATED APPLICATIONS

The present application claims priority under 35 U.S.C. §119 to Japanese Patent Applications No. 2007-076051 and No. 2007-076052, both filed Mar. 23, 2007. The contents of these applications are incorporated herein by reference in their entirety.

BACKGROUND OF THE INVENTION

1. Field of the Invention

The present invention relates to a semiconductor-encapsulating resin composition and a semiconductor device.

2. Discussion of the Background

In the recent market trend of decreasing size, decreasing weight, and increasing performance of electronic devices, the degree of integration of semiconductor elements (hereinafter also referred to as "elements" or "chips") is increasing year by year, and surface mounting of semiconductor devices (hereinafter also referred to as "packages") has also been accelerated. Accordingly, the requirements for a semiconductor-encapsulating resin composition (hereinafter also referred to as "encapsulating material" or "molding compound for encapsulating") have become more severe. In particular, in a current typical surface mounting process of a semiconductor device, when a semiconductor device that has absorbed moisture is exposed to a high-temperature atmosphere during a soldering process, the semiconductor device receives explosive stress due to vaporized steam. As a result, cracks are formed in the semiconductor device, or detachment occurs at the interface between the semiconductor device or a lead frame and a cured product of a semiconductor-encapsulating resin composition. In such a case, the electrical reliability of the final semiconductor device may be significantly impaired. Accordingly, prevention of such defects, more specifically, an improvement in solder resistance of a semiconductor-encapsulating resin composition has been strongly desired. Furthermore, with the continuing elimination of use of lead, the frequency of use of lead-free solder, which has a melting point higher than conventional solder, has been increasing. In the case where such lead-free solder is used, it is necessary to increase the temperature during semiconductor mounting by about 20° C. compared with the case where conventional solder is used. When a semiconductor is mounted at such a high temperature, the reliability of the semiconductor device after mounting is significantly degraded, as compared with a conventional case. In addition, in view of environmental problems, a desire for imparting flame resistance to a encapsulating resin without using a flame retardant such as a Br compound or antimony oxide has also been increasing.

In order to improve solder resistance and flame resistance, it is believed that the use of a encapsulating resin containing a large amount of an inorganic filler is effective. The inorganic filler decreases the water-absorbing property of a resin and improves solder resistance. Furthermore, by using an inorganic filler in a large amount, the content of a flammable resin component in the resin can be decreased to improve flame resistance. In view of this circumstance, recent semiconductor-encapsulating resin compositions contain a crystalline epoxy resin having a lower viscosity and a larger amount of inorganic filler so as to have a high flowability with a low viscosity during molding. For example, Japanese Unexamined Patent Application Publication No. 7-130919 and Japanese Unexamined Patent Application Publication No. 8-20673 disclose such semiconductor-encapsulating resin compositions. The contents of these publications are incorporated herein by reference in their entirety. However, a method that can combine satisfactory solder resistance with satisfactory flame resistance during mounting has not yet been known.

Consequently, the present applicant has proposed a biphenylene-structure-containing phenol-aralkyl-type epoxy resin and an epoxy resin composition containing a biphenylene-structure-containing phenol-aralkyl-type curing agent that have excellent solder resistance and flame resistance. For example, Japanese Unexamined Patent Application Publication No. 11-140277 discloses such epoxy resin or epoxy resin composition. The contents of this publication are incorporated herein by reference in their entirety. This epoxy resin composition contains a large number of aromatic rings in its molecular structure, and thus, a carbonized layer is formed on the surface layer of a molded product of the resin composition during burning. Accordingly, further burning can be suppressed, and the resin composition exhibits excellent flame resistance. Furthermore, the presence of the aromatic rings improves hydrophobicity of the composition. Furthermore, the presence of the aromatic rings increases the distance between cross-linking points of the resin. As a result, the modulus of elasticity of the composition at high temperatures is decreased, thereby improving solder resistance.

Recently, further improvements in solder resistance and flame resistance of a encapsulating resin have been desired. It is believed that a solution to realize this desire is to increase the content of an inorganic filler.

In addition, with a recent increase in the number of I/O terminals of semiconductor devices, the pitch of bonding wires that electrically connect a silicon chip to a circuit on a substrate tends to be decreased. Therefore, high flowability of encapsulating resins is desired. However, the melt viscosities of biphenylene-structure-containing phenol-aralkyl-type epoxy resins and biphenylene-structure-containing phenol-aralkyl-type curing agents which are used in the encapsulating resins are not low, and thus, the flowability of the encapsulating resins is decreased. Consequently, a method in which the melt viscosity is decreased by decreasing the molecular weight of the resins is often employed. However, this method often impairs the curability of the resins.

SUMMARY OF THE INVENTION

According to one aspect of the present invention, a semiconductor-encapsulating resin composition includes a curing agent and a compound (A) having a plurality of glycidyl ether groups. When ion viscosity of the resin composition is measured under conditions of a measurement temperature of about 175° C. and a measurement frequency of about 100 Hz, minimum ion viscosity appears at about 5 seconds or later and within about 40 seconds from a measurement starting point. The minimum ion viscosity is at least about 4.0 and at most about 7.0. A maximum slope of the ion viscosity appears at about 10 seconds or later and within about 60 seconds from the measurement starting point. The maximum slope is at least about 2.0 and at most about 6.0.

According to another aspect of the present invention, a semiconductor device which is produced by encapsulating a semiconductor element with a cured product of a semiconductor-encapsulating resin composition is provided. The a semiconductor-encapsulating resin composition includes a curing agent and a compound (A) having a plurality of gly- cidyl ether groups. When ion viscosity of the resin composition is measured under conditions of a measurement temperature of about 175° C. and a measurement frequency of about 100 Hz, minimum ion viscosity appears at about 5 seconds or later and within about 40 seconds from a measurement starting point. The minimum ion viscosity is at least about 4.0 and at most about 7.0. A maximum slope of the ion viscosity appears at about 10 seconds or later and within about 60 seconds from the measurement starting point. The maximum slope is at least about 2.0 and at most about 6.0.

According to further aspect of the present invention, a semiconductor-encapsulating resin composition includes a compound (A) having two or more glycidyl ether groups and a compound (B) represented by general formula (1).

(1)

In the formula (1), —$Ar_1$— is at least one group selected from a substituted or unsubstituted phenylene group, a 1-naphthylene group, a 2-naphthylene group, an oxybiphenylene group, and a biphenylene group; —$Ar_2$— is at least one group selected from a phenylene group, a biphenylene group, and a naphthylene group; X is a hydrogen atom or an organic group that has 1 to 20 carbon atoms; each of substituents R1 introduced in —$Ar_1$— is an organic group having 1 to 20 carbon atoms, and substituents R1 are same or different; each of substituents R2 introduced in —$Ar_2$— is an alkyl group having 1 to 4 carbon atoms, and substituents R2 are same or different; k is an integer at least 0 and at most 7; l is an integer at least 0 and at most 8; and an average of m and n is a positive number more than 0 and less than 10.

According to further aspect of the present invention, a semiconductor device which is produced by encapsulating a semiconductor element with a cured product of a semiconductor-encapsulating resin composition is provided. The resin composition includes a compound (A) having two or more glycidyl ether groups and a compound (B) represented by general formula (1).

(1)

In the formula (1), —$Ar_1$— is at least one group selected from a substituted or unsubstituted phenylene group, a 1-naphthylene group, a 2-naphthylene group, an oxybiphenylene group, and a biphenylene group; —$Ar_2$— is at least one group selected from a phenylene group, a biphenylene group, and a naphthylene group; X is a hydrogen atom or an organic group that has 1 to 20 carbon atoms; each of substituents R1 introduced in —$Ar_1$— is an organic group having 1 to 20 carbon atoms, and substituents R1 are same or different; each of substituents R2 introduced in —$Ar_2$— is an alkyl group having 1 to 4 carbon atoms, and substituents R2 are same or different; k is an integer at least 0 and at most 7; l is an integer at least 0 and at most 8; and an average of m and n is a positive number more than 0 and less than 10.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

An embodiment of the present invention provides a semiconductor-encapsulating resin composition containing a compound (A) having two or more glycidyl ether groups and a curing agent, wherein when the ion viscosity is measured with time using a dielectric analyzer under the conditions of a measurement temperature of about 175° C. and a measurement frequency of about 100 Hz, the appearance time of the minimum ion viscosity is about 5 seconds or more and about 40 seconds or less from the start of the measurement, the minimum ion viscosity is about 4.0 or more and about 7.0 or less, the appearance time of the maximum slope of the ion viscosity is about 10 seconds or more and about 60 seconds or less from the start of the measurement, and the maximum slope is about 2.0 or more and about 6.0 or less. The resin composition according to an embodiment of the present invention has these characteristics, and thus has both excellent flowability and high curability.

Each of components will now be descried in detail.

Hitherto, a spiral flow, a Koka's flow viscosity tester, a Brabender, a Labo Plastomill, or the like has been used as a method of evaluating viscosity characteristics and flowability of a semiconductor-encapsulating resin composition. However, the results obtained by using these apparatuses significantly depend on the mixing ratio of a filler contained in the semiconductor-encapsulating resin composition. Therefore, it is difficult to accurately evaluate viscosity characteristics and flowability of a resin composition containing a base resin, a curing agent, a curing accelerator, and other components. Hitherto, a Curelastometer or the like has been used as a method of evaluating the curing behavior of a semiconductor-encapsulating resin composition. However, the results obtained by using such an apparatus depend on the mixing ratio of a filler contained in the semiconductor-encapsulating resin composition to a certain degree. Therefore, it is difficult to accurately evaluate the curing behavior of a resin composition containing a base resin, a curing agent, a curing accelerator, and other components. Each of the minimum ion viscosity and the slope, which is the differential value of the ion viscosity, obtained when a semiconductor-encapsulating resin composition is measured with a dielectric analyzer is an indicator representing viscosity characteristics and the curing behavior of the semiconductor-encapsulating resin composition. In addition, since these values are obtained on the basis of a change in the dielectric property of a resin composition, these values are suitable for use in evaluating viscosity characteristics and the curing behavior of the resin composition.

Figure 1:
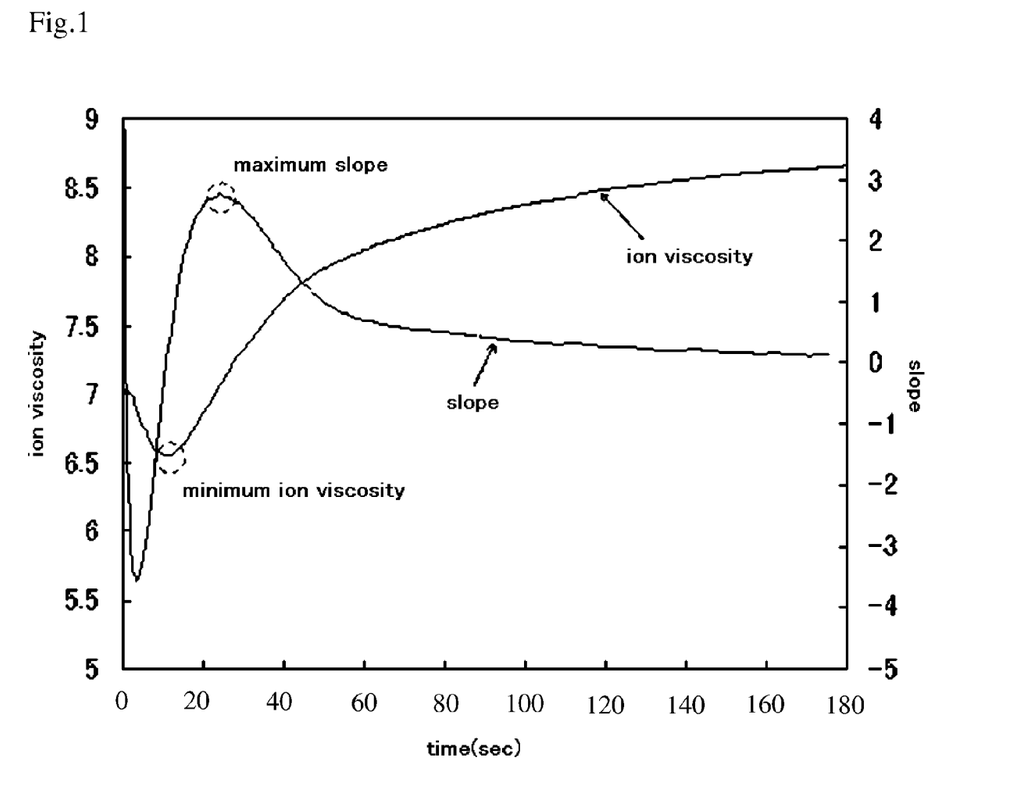
FIG. 1 is a graph showing the profiles of the ion viscosity and the slope obtained when a semiconductor-encapsulating resin composition according to an embodiment of the present invention is measured with a dielectric analyzer.

FIG. 1 is a graph showing the profiles of the ion viscosity and the slope obtained when a semiconductor-encapsulating resin composition according to an embodiment of the present invention is measured with a dielectric analyzer. The ion viscosity becomes the minimum at the stage in which the entire resin composition has melted. Subsequently, as the resin composition is cured, the ion viscosity increases. The slope is a differential value of the ion viscosity and increases as the rate of increase of the ion viscosity increases. A point at which the rate of increase of the ion viscosity becomes the maximum is the maximum slope value. The appearance time of the minimum ion viscosity is an indicator representing the ease of melting of the resin, and the value of the minimum ion viscosity is an indicator representing the minimum viscosity of the resin. The appearance time of the maximum slope is an indicator representing the timing of rising of curing of the resin, and the value of the maximum slope is an indicator representing the rising speed of curing of the resin.

The minimum ion viscosity obtained when a semiconductor-encapsulating resin composition according to an embodiment of the present invention is measured using a dielectric analyzer under the conditions of a measurement temperature of about 175° C. and a measurement frequency of about 100 Hz preferably appears about 5 seconds or more and about 40 seconds or less from the start of the measurement, and the value of the minimum ion viscosity is about 4.0 or more and about 7.0 or less. More preferably, the minimum ion viscosity appears about 7 seconds or more and about 30 seconds or less from the start of the measurement, and the value of the minimum ion viscosity is about 4.5 or more and about 6.4 or less. Further preferably, the minimum ion viscosity appears about 9 seconds or more and about 20 seconds or less from the start of the measurement, and the value of the minimum ion viscosity is about 5.0 or more and about 6.3 or less. When the appearance time of the minimum ion viscosity is below the above lower limit, resin bleeding may occur at an air vent portion or the like during molding of the semiconductor-encapsulating resin composition. When the appearance time of the minimum ion viscosity exceeds the above upper limit, the filling property of the semiconductor-encapsulating resin composition during molding may be degraded. Furthermore, when the value of the minimum ion viscosity is below the above lower limit, resin bleeding may occur at an air vent portion or the like during molding of the semiconductor-encapsulating resin composition. When the value of the minimum ion viscosity exceeds the above upper limit, sweeping of gold wires connected to a semiconductor element may be degraded during molding of the semiconductor-encapsulating resin composition.

The maximum slope obtained when the semiconductor-encapsulating resin composition according to an embodiment of the present invention is measured using a dielectric analyzer under the conditions of a measurement temperature of about 175° C. and a measurement frequency of about 100 Hz preferably appears about 10 seconds or more and about 60 seconds or less from the start of the measurement, and the value of the maximum slope is about 2.0 or more and about 6.0 or less. More preferably, the maximum slope appears about 15 seconds or more and about 55 seconds or less from the start of the measurement, and the value of the maximum slope is about 2.3 or more and about 5.5 or less. Further preferably, the maximum slope appears about 20 seconds or more and about 50 seconds or less from the start of the measurement, and the value of the maximum slope is about 2.5 or more and about 5.0 or less. When the appearance time of the maximum slope is below the above lower limit, an increase in the viscosity occurs at the early stage because curing occurs at an excessively high speed. As a result, sweeping of gold wires connected to a semiconductor element may be degraded during molding of the semiconductor-encapsulating resin composition. When the appearance time of the maximum slope exceeds the above upper limit, the curability of the semiconductor-encapsulating resin composition during molding may be degraded. When the value of the maximum slope is below the above lower limit, the curability becomes insufficient, and thus, continuous productivity of a semiconductor device may be degraded. When the value of the maximum slope exceeds the above upper limit, an increase in the viscosity occurs at the early stage, and thus, sweeping of gold wires connected to a semiconductor element may be degraded during molding of the semiconductor-encapsulating resin composition.

As the dielectric analyzer, a DEA231/1 (trademark) cure analyzer manufactured by NETZSCH can be used. As a press, an MP235 MINI-PRESS (trademark) manufactured by NETZSCH can be used. The measurement can be performed in accordance with ASTM E2039.

In the semiconductor-encapsulating resin composition according to an embodiment of the present invention, when the ion viscosity of the resin composition is measured using a dielectric analyzer under the conditions of a measurement temperature of about 175° C. and a measurement frequency of about 100 Hz, the minimum ion viscosity appears about 5 seconds or more and about 40 seconds or less from the start of the measurement, the value of the minimum ion viscosity is about 4.0 or more and about 7.0 or less, the maximum slope appears about 10 seconds or more and about 60 seconds or less from the start of the measurement, and the value of the maximum slope is about 2.0 or more and about 6.0 or less. Such a resin composition can be obtained by adjusting the type of compound (A) having two or more glycidyl ether groups, the type of curing agent, and the mixing ratio thereof. In particular, the selection of the type of curing agent is important. Furthermore, these characteristics can be adjusted by appropriately selecting and mixing a curing accelerator (D), a silane coupling agent (E), and a compound (F) in which a hydroxyl group is bonded to each of two or more adjacent carbon atoms constituting aromatic rings, and other components, all of which can affect flowability and curability of the semiconductor-encapsulating resin composition during molding.

Examples of the compound (A) having two or more glycidyl ether groups used in the embodiment of the present invention include, but are not particularly limited to, epoxy resins that are generally used and that have two or more glycidyl ether groups in one molecule. Specific examples thereof include epoxidized resins of a novolak-type phenolic resin obtained by allowing a phenolic compound or a naphthol compound such as phenol, cresol, 1-naphthol, 2-naphthol, or dihydroxynaphthalene to react with an aldehyde compound such as formaldehyde, acetaldehyde, benzaldehyde, or salicylaldehyde in the presence of an acid catalyst; resins obtained by epoxidizing bisphenol A, bisphenol F, oxydiphenol, thiobisphenol, or biphenol; resins obtained by epoxidizing a dicyclopentadiene-modified phenolic resin; resins obtained by epoxidizing a phenol aralkyl resin having a phenylene structure or a biphenylene structure; resins obtained by epoxidizing a naphthol aralkyl resin having a phenylene structure or a biphenylene structure; resins obtained by epoxidizing a triphenolmethane-type phenolic resin; resins obtained by epoxidizing an alkyl-modified triphenolmethane-type phenolic resin; epoxy resins containing a triazine nucleus; and dihydroanthrahydroquinone glycidyl-etherified epoxy resins. These resins may be used alone or in combinations of two or more resins. Among these, a resin obtained by epoxidizing biphenol, a resin obtained by epoxidizing bisphenol F, a resin obtained by epoxidizing thiobisphenol, a resin obtained by epoxidizing a phenol aralkyl resin having a phenylene structure; a resin obtained by epoxidizing a naphthol aralkyl resin having a phenylene structure; a resin obtained by epoxidizing a phenol aralkyl resin having a biphenylene structure; a resin obtained by epoxidizing a novolak-type phenolic resin; a resin obtained by epoxidizing a dicyclopentadiene-modified phenolic resin; or a dihydroanthrahydroquinone glycidyl-etherified epoxy resin is preferred.

Furthermore, among these, when a resin obtained by epoxidizing biphenol (biphenyl-type epoxy resin), a resin obtained by epoxidizing bisphenol A (bisphenol A-type epoxy resin), or a resin obtained by epoxidizing bisphenol F (diphenylmethane-type epoxy resin) is used, a semiconductor-encapsulating resin composition having a low minimum ion viscosity measured with a dielectric analyzer and excellent flowability can be obtained. When a resin obtained by epoxidizing a phenol aralkyl resin having a phenylene structure (phenol aralkyl-type epoxy resin) or a resin obtained by epoxidizing a phenol aralkyl resin having a biphenylene structure (phenol aralkyl-type epoxy resin) is used, a semiconductor-encapsulating resin composition having excellent solder resistance can be obtained. When a triphenolmethane-type epoxy resin, a naphthol-type epoxy resin, a dihydroanthrahydroquinone glycidyl-etherified epoxy resin, or the like is used, a semiconductor-encapsulating resin composition having an excellent low-warping property can be obtained.

In view of moisture-resistant reliability of the resulting semiconductor-encapsulating resin composition, the contents of Na ion and Cl ion, which are ionic impurities, contained in the epoxy resin are preferably as small as possible. From the viewpoint of the curability of the resin composition, the epoxy equivalent of the epoxy resin is preferably about 100 g/eq or more and about 500 g/eq or less.

The lower limit of the amount of compound (A) having two or more glycidyl ether groups used in the embodiment of the present invention is not particularly limited, but preferably 2 weight percent or more, and more preferably, 4 weight percent or more relative to the total weight of the epoxy resin. When the lower limit of the amount mixed is within the above range, for example, a decrease in flowability of the resulting resin composition can be suppressed. The upper limit of the amount of compound (A) is preferably 12 weight percent or less, and more preferably, 10 weight percent or less relative to the total weight of the epoxy resin. When the upper limit of the amount mixed is within the above range, for example, a decrease in solder resistance can be suppressed.

The curing agent used in the embodiment of the present invention preferably has an ICI viscosity of about 0.10 dPa·s or more and about 2.0 dPa·s or less at 150° C. and a softening point of about 50° C. or higher and about 90° C. or lower. When the ICI viscosity is below the lower limit, blocking easily occurs in the resulting semiconductor-encapsulating resin composition. When the ICI viscosity exceeds the upper limit, the flowability of the resulting resin composition may be adversely affected. When the softening point is below the lower limit, blocking easily occurs during the storage of the resulting resin. When the softening point exceeds the upper limit, flowability of the resulting resin composition may be adversely affected. Furthermore, a curing agent having an ICI viscosity of about 0.10 dPa·s or more and about 0.65 dPa·s or less at 150° C. is more preferably used in the embodiment of the present invention. A curing agent having an ICI viscosity of about 0.20 dPa·s or more and about 0.55 dPa·s or less at 150° C. is particularly preferably used in the embodiment of the present invention. In the case where other components such as the compound (A) having two or more glycidyl ether groups and the curing accelerator (D) are the same, as the ICI viscosity at 150° C. of the curing agent is low, the minimum ion viscosity of the resulting semiconductor-encapsulating resin composition measured with a dielectric analyzer can be decreased. As a result, a semiconductor-encapsulating resin composition having excellent flowability can be obtained. The curing agent used in the embodiment of the present invention more preferably has a softening point of about 50° C. or higher and about 65° C. or lower, and particularly preferably has a softening point of about 52° C. or higher and about 65° C. or lower.

Examples of such a curing agent include, but are not particularly limited to, a compound (B) represented by general formula (1) below. The compound (B) can realize an improvement in flowability due to a decrease in the melt viscosity, and an improvement in the curability due to an increase in the cross-linking density without impairing solder resistance and flame resistance, which are features of phenol aralkyl resins. The compound (B) represented by general formula (1) is a compound including a phenol structure portion represented by —Ar$_1$— to which an OH group is bonded, a portion composed of a phenol structure represented by —Ar$_1$— to which an OH group is bonded and a methylene-based structure having a substituent X (m repeating units 1), and a portion composed of an aromatic structure represented by —Ar$_2$— and a methylene group (n repeating units 2). These repeating units may be arranged alternately or at random. The compound (B) represented by general formula (1) can be a mixture containing a plurality of components having different composition ratios of the repeating unit 1 to the repeating unit 2. The ratio of m to n can be controlled by changing the feeding molar ratio of starting material components. Thereby, a semiconductor-encapsulating resin composition having excellent balance of flowability and curability can be obtained. Examples of the compound (B) include, but are not particularly limited to, compounds represented by general formula (6).

(1)

In formula (1),

—Ar$_1$— is a group selected from a substituted or unsubstituted phenylene group, a 1-naphthylene group, a 2-naphthylene group, an oxybiphenylene group, and a biphenylene group;

—Ar$_2$— is a group selected from a phenylene group, a biphenylene group, and a naphthylene group;

X is a hydrogen atom or an organic group that has 1 to 20 carbon atoms and that may have a hydroxyl group;

each of substituents R1 introduced in —Ar$_1$— is an organic group having 1 to 20 carbon atoms, and substituents R1 may be the same or different;

each of substituents R2 introduced in —Ar$_2$— is an alkyl group having 1 to 4 carbon atoms, and substituents R2 may be the same or different;

k is an integer in the range of 0 to 7;

l is an integer in the range of 0 to 8; and each of the averages of m and n is a positive number more than 0 and less than 10.

(6)

In general formula (6),

—Ar$_1$— is a group selected from a phenylene group, a 1-naphthylene group, a 2-naphthylene group, an oxybiphenylene group, and a biphenylene group;

—Ar$_2$— is a group selected from a phenylene group, a biphenylene group, and a naphthylene group;

however, the case where both —Ar$_1$— and —Ar$_2$— are phenylene groups is eliminated;

X is a hydrogen atom or an organic group that has 1 to 20 carbon atoms and that may have a hydroxyl group, each of substituents R1 introduced in —Ar$_1$— is an organic group having 1 to 20 carbon atoms, and substituents R1 may be the same or different;

each of substituents R2 introduced in —Ar$_2$— is an alkyl group having 1 to 4 carbon atoms, and substituents R2 may be the same or different;

k is an integer in the range of 0 to 7;

l is an integer in the range of 0 to 8; and each of the averages of p and q is a positive number more than 0 and less than 10.

In general formula (1), —Ar$_1$— is a group selected from a phenylene group, a 1-naphthylene group, a 2-naphthylene group, an oxybiphenylene group, and a biphenylene group; and —Ar$_2$— is a group selected from a phenylene group, a biphenylene group, and a naphthylene group. When —Ar$_1$— is a naphthylene group, a cured product of a semiconductor-encapsulating resin composition containing such a compound has a small coefficient of linear expansion. When —Ar$_1$— is a biphenylene group, a semiconductor-encapsulating resin composition containing such a compound has satisfactory flame resistance. When —Ar$_1$— is a phenylene group, a semiconductor-encapsulating resin composition containing such a compound has a satisfactory melt viscosity during molding and satisfactory curability. Among these, from the standpoint of the balance of the melt viscosity and curability, —Ar$_1$— is preferably a phenylene group. When —Ar$_2$— is a naphthylene group, a cured product of a semiconductor-encapsulating resin composition containing such a compound has a small coefficient of linear expansion. When —Ar$_2$— is a phenylene group or a biphenylene group, a semiconductor-encapsulating resin composition containing such a compound has a satisfactory melt viscosity during molding and satisfactory curability, and a cured product of this resin composition has satisfactory solder resistance and flame resistance. Among these, from the standpoint of the balance of the melt viscosity, curability, solder resistance, and flame resistance, —Ar$_2$— is preferably a phenylene group or a biphenylene group.

Each of substituents R1 introduced in —Ar$_1$— is an organic group having 1 to 20 carbon atoms, and substituents R1 may be the same or different. More specifically, R1 preferably an alkyl group selected from a methyl group, an ethyl group, a propyl group, a butyl group, an isopropyl group, a tert-butyl group, a pentyl group, a hexyl group, and the like; or an aromatic structure group selected from a phenyl group; alkyl-group-introduced phenyl groups such as a methylphenyl group, a dimethylphenyl group, and a methylethylphenyl group; a hydroxy-group-introduced phenyl group; alkyl-group-introduced or non-introduced naphthyl groups; alkyl-group-introduced or non-introduced biphenyl groups; alkyl-group-introduced or non-introduced anthracenyl groups; and the like. Among these, from the standpoint of the balance of melt viscosity, curability, and the like, each of substituents R1 is more preferably a phenyl group or an alkyl-group-introduced phenyl group. Alternatively, more preferably, substituent R1 is not introduced.

Each of substituents R2 introduced in —Ar$_2$— is an alkyl group having 1 to 4 carbon atoms, and substituents R2 may be the same or different. More specifically, R2 is preferably an alkyl group having 1 to 4 carbon atoms selected from a methyl group, an ethyl group, a propyl group, a butyl group, isopropyl group, a tert-butyl group, and the like. Among these, from the standpoint of the balance of melt viscosity, curability, and the like, more preferably, substituent R2 is a methyl group, or substituent R2 is not introduced.

In general formula (1), k, which is the number of substituents R1 introduced in —Ar$_1$—, is an integer in the range of 0 to 7, and l, which is the number of substituents R2 introduced in —Ar$_2$—, is an integer in the range of 0 to 8. Among these, from the standpoint of the balance of melt viscosity, curability, and the like, each of k and l is preferably in the range of 0 to 3, and more preferably, in the range of 0 or 1.

In general formula (1), each of m and n is an integer in the range of 0 to 10, and each of the averages of m and n is a positive number more than 0 and less than 10. Among these, from the standpoint of the balance of melt viscosity and curability, each of m and n is preferably in the range of 0 to 8, and more preferably, in the range of 0 to 5. In addition, in the compound (B) represented by general formula (1), as the content of a component in which m≠0 and n≠0 and the content of a component in which m=0 and n=0 increase, the minimum ion viscosity tends to decrease and the maximum slope tends to increase when the resulting semiconductor-encapsulating resin composition is measured with a dielectric analyzer. Accordingly, flowability and curability of the semiconductor-encapsulating resin composition can be controlled by adjusting these contents. From the standpoint of the balance of melt viscosity, curability, and the like, the ratio of the area of a component in which m≠0 and n≠0 in general formula (1) to the total area of the compound (B) in a GPC chart is preferably about 5% or more and about 55% or less, and more preferably, about 10% or more and about 40% or less. Furthermore, when the compound (B) contains the component in which m=0 and n=0 in general formula (1), the viscosity of the resulting composition can be decreased. In particular, from the standpoint of the balance of melt viscosity, curability, and the like, the ratio of the area of a component in which m=0 and n=0 to the total area of the compound (B) in the GPC chart is preferably about 0.1% or more and about 40% or less, and more preferably, about 10% or more and about 30% or less. Regarding the measurement by GPC, for example, a W2695 manufactured by Waters Corporation can be used as a measuring apparatus, and a TSK-GEL manufactured by Showa Denko K.K. can be used as a column. The components are easily separated at a column temperature of about 40° C. and a flow rate of about 1.0 mL/min using tetrahydrofuran (THF) as a mobile phase.

A method of producing the compound (B) represented by general formula (1) is not particularly limited. For example, the compound (B) can be obtained by allowing a phenolic-hydroxyl-group-containing aromatic compound such as phenol, cresol, 1-naphthol, 2-naphthol, phenylphenol, or biphenol to react with a bifunctional alkoxyalkyl-group-containing aromatic compound or a bifunctional halogenoalkyl-group-containing aromatic compound such as dimethoxyparaxylylene, dichloroparaxylylene, bis(methoxymethyl)biphenyl, bis(chloromethyl)biphenyl, or bis(methoxymethyl)naphthalene; and an aldehyde compound such as formaldehyde, benzaldehyde, or salicylaldehyde in the presence of an acidic catalyst. Alternatively, the compound (B) is obtained by allowing a phenolic-hydroxyl-group-containing aromatic compound such as phenol, cresol, 1-naphthol, 2-naphthol, phenylphenol, or biphenol to react with a bifunctional alkoxyalkyl-group-containing aromatic compound or a bifunctional halogenoalkyl-group-containing aromatic compound such as dimethoxyparaxylylene, dichloroparaxylylene, bis(methoxymethyl)biphenyl, bis(chloromethyl)biphenyl, or bis(methoxymethyl)naphthalene in advance in the presence of an acidic catalyst to prepare a reaction product; and then allowing the resulting reaction product to react with a phenolic-hydroxyl-group-containing aromatic compound such as phenol, cresol, 1-naphthol, 2-naphthol, phenylphenol, or biphenol and an aldehyde compound such as formaldehyde, benzaldehyde, or salicylaldehyde in the presence of an acidic catalyst. In the compound (B) represented by general formula (1), by increasing the feeding molar ratio of the aldehyde compound, which is formed into the repeating unit 1, and decreasing the feeding molar ratio of the bifunctional alkoxyalkyl-group-containing aromatic compound or a bifunctional halogenoalkyl-group-containing aromatic compound, which is formed into the repeating unit 2 accordingly, in general formula (1), the content of a component in which m≠0 and n≠0 and the content of a component in which m=0 and n=0 can be increased.

In an embodiment of the present invention, a compound (C) having two or more phenolic hydroxyl groups can be used as the curing agent in combination with the compound (B) represented by general formula (1). The compound (C) that can be used is not particularly limited. Examples thereof include novolak-type phenolic resins, novolak-type naphthol resins, and triphenolmethane-type phenolic resins obtained by allowing a phenolic compound such as phenol, cresol, catechol, phenylphenol, biphenol, bisphenol A, or bisphenol F, or a naphthol compound such as 1-naphthol, 2-naphthol, or dihydroxynaphthalene to react with an aldehyde compound such as formaldehyde, benzaldehyde, or salicylaldehyde in the presence of an acidic catalyst; phenol aralkyl resins having a phenylene structure and/or a biphenylene structure and naphthol aralkyl resins having a phenylene structure and/or a biphenylene structure obtained by allowing a phenolic compound or a naphthol compound to react with, for example, dimethoxyparaxylylene, dichloroparaxylylene, bis(methoxymethyl)biphenyl, or bis(chloromethyl)biphenyl in the presence of an acidic catalyst; terpene-modified phenolic resins; dicyclopentadiene-modified phenolic resins; and bisphenol compounds. Among these, from the standpoint of curability, resins having a hydroxyl equivalent of 90 g/eq or more and 300 g/eq or less are preferred.

Among these, from the standpoint of viscosity and curability, novolak-type phenolic resins and phenol aralkyl resins having a phenylene structure are preferred. From the standpoint of the warping property, naphthol aralkyl resins having a phenylene structure are preferred. From the standpoint of solder resistance, phenol aralkyl resins having a biphenylene structure and dicyclopentadiene-type phenolic resins are preferred. From the standpoint of flame resistance, phenol aralkyl resins having a phenylene structure, naphthol aralkyl resins having a phenylene structure, and phenol aralkyl resins having a biphenylene structure are preferred. These resins may be used alone or in combinations of two or more resins.

The amount of compound (B) mixed is not particularly limited. However, from the standpoint of the balance of melt viscosity, curability, and the like, the amount of compound (B) is preferably about 25 weight percent or more, more preferably about 50 weight percent or more, and further preferably about 70 weight percent or more relative to the total amount of compound (B) and compound (C).

The lower limit of the total amount of compound (B) and compound (C) is not particularly limited, but is preferably 2 weight percent or more, and more preferably 3 weight percent or more relative to the total amount of epoxy resin used. When the lower limit of the amount mixed is within the above range, for example, a decrease in flowability does not easily occur. The upper limit of the total amount of compound (B) and compound (C) is preferably about 10 weight percent or less, and more preferably about 8 weight percent or less relative to the total amount of epoxy resin used. When the upper limit of the amount mixed is within the above range, for example, a decrease in solder resistance does not easily occur.

The ratio of the amount of compound (A) to the total amount of compound (B) and compound (C) is represented by a ratio (EP/OH) of the number of glycidyl ether groups (EP) in the compound (A) to the number of phenolic hydroxyl groups (OH) in the compound (B) and the compound (C). The ratio EP/OH is preferably about 0.6 or more and about 1.5 or less, and more preferably about 0.8 or more and about 1.3 or less. When the equivalent ratio (EP/OH) is within the above range, the possibility of a decrease in curability of the semiconductor-encapsulating resin composition is small. Furthermore, when the equivalent ratio (EP/OH) is within the above range, the possibility of a decrease in the glass transition temperature or a degradation of moisture-resistant reliability is small in a cured product of the semiconductor-encapsulating resin composition.

In the compound (B), the ratio of the number of carbon atoms constituting aromatic rings to the total number of carbon atoms is as high as about 90%. By using this compound (B), a cured product of the semiconductor-encapsulating resin composition according to an embodiment of the present invention can easily satisfy the V-0 standard of flame resistance determined by the UL-94 vertical method without containing a halogen flame retardant such as a brominated epoxy resin, or a heavy-metal flame retardant such as antimony oxide. Herein, the term "carbon atoms constituting aromatic rings" means net carbon atoms that do not have a substituent or a bonding group and that form aromatic rings. In the embodiment of the present invention, in order to improve flame resistance, additives, for example, a flame retardant such as a metal hydroxide, e.g., aluminum hydroxide or magnesium hydroxide; zinc borate; zinc molybdate; or a phosphazene may be optionally mixed.

The resin composition according to an embodiment of the present invention can further contain a curing accelerator (D). Curing accelerators that are used in typical semiconductor-encapsulating resin compositions can be used as long as the curing accelerator (D) accelerates a reaction between the glycidyl ether groups of the compound (A) having two or more glycidyl ether groups and the phenolic hydroxyl groups of the compound (B) represented by general formula (1) and those of the compound (C) having two or more phenolic hydroxyl groups. Specific examples thereof include phosphorus-atom-containing compounds such as organic phosphines, tetrasubstituted phosphonium compounds, phosphobetaine compounds, adducts of a phosphine compound and a quinone compound, and adducts of a phosphonium compound and a silane compound; and nitrogen-atom-containing compounds such as 1,8-diazabicyclo(5,4,0)undecene-7, benzyldimethylamine, and 2-methylimidazole. Among these, the phosphorus-atom-containing compounds are preferred. In particular, from the standpoint that flowability can be improved by decreasing the minimum ion viscosity of the semiconductor-encapsulating resin composition, and furthermore, in view of the rising speed of curing, tetrasubstituted phosphonium compounds are preferred. In view of a low modulus of elasticity during heating of a cured product of the semiconductor-encapsulating resin composition, phosphobetaine compounds and adducts of a phosphine compound and a quinone compound are preferred. Furthermore, in view of the latent curability of the resin composition, adducts of a phosphonium compound and a silane compound are preferred.

Examples of the organic phosphines include primary phosphines such as ethylphosphine, and phenylphosphine; secondary phosphines such as dimethylphosphine and diphenylphosphine; and tertiary phosphines such as trimethylphosphine, triethylphosphine, tributylphosphine, and triphenylphosphine.

Examples of the tetrasubstituted phosphonium compounds include compounds represented by general formula (2):

(2)

In general formula (2),

P is a phosphorus atom;

Each of R3, R4, R5, and R6 is an aromatic group or an alkyl group, and R3, R4, R5, and R6 may be the same or different;

A is an anion of an aromatic organic acid in which at least one functional group selected from a hydroxyl group, a carboxyl group, and a thiol group is bonded to an aromatic ring;

AH is an aromatic organic acid in which at least one functional group selected from a hydroxyl group, a carboxyl group, and a thiol group is bonded to an aromatic ring;

each of a and b is an integer in the range of 1 to 3; c is an integer in the range of 0 to 3; and a=b.

The compound represented by general formula (2) can be produced, for example, as follows, but the method is not limited thereto. First, a tetrasubstituted phosphonium halide, an aromatic organic acid, and a base are added to an organic solvent and uniformly mixed to produce an aromatic organic acid anion in the solution system. Subsequently, water is added to the solution, and thus, the compound represented by general formula (2) can be precipitated. In the compound represented by general formula (2), each of R3, R4, R5, and R6 bonded to a phosphorus atom is preferably a phenyl group, AH is preferably a compound in which a hydroxyl group is bonded to an aromatic ring, i.e., a phenolic compound, and A is preferably an anion of the phenolic compound.

Examples of the phosphobetaine compounds include compounds represented by general formula (3):

(3)

In general formula (3),

P is a phosphorus atom;

X1 is an alkyl group having 1 to 3 carbon atoms;

Y1 is a hydroxyl group; and each of d and e is an integer in the range of 0 to 3.

The compound represented by general formula (3) can be produced, for example, as follows. First, a triaromatic-substituted phosphine, which is a tertiary phosphine, is brought into contact with a diazonium salt to introduce a diazonium group of the diazonium salt into the triaromatic substituted phosphine. Thus, the compound represented by general formula (3) can be produced. However, the method is not limited to this.

Examples of the adducts of a phosphine compound and a quinone compound include compounds represented by general formula (4):

(4)

In general formula (4),

P is a phosphorus atom;

each of R7, R8, and R9 is an alkyl group having 1 to 12 carbon atoms or an aryl group having 6 to 12 carbon atoms, and R7, R8, and R9 may be the same or different;

each of R10, R11, and R12 is a hydrogen atom or an organic group having 1 to 12 carbon atoms and R10, R11, and R12 may be the same or different, or R10 and R11 may be bonded to form a cyclic structure.

Examples of the phosphine compound used for the adducts of a phosphine compound and a quinone compound include unsubstituted-aromatic-ring-containing phosphines such as triphenylphosphine, tris(alkylphenyl)phosphine, tris(alkoxyphenyl)phosphine, trinaphthylphosphine, and tris(benzyl)phosphine; and phosphines containing an aromatic ring substituted with an alkyl group or an alkoxy group. Examples of the alkyl group and the alkoxy group include alkyl groups having 1 to 6 carbon atoms and alkoxy groups having 1 to 6 carbon atoms. From the standpoint of availability, triphenylphosphine is preferred.

Examples of the quinone compound used for the adducts of a phosphine compound and a quinone compound include o-benzoquinone, p-benzoquinone, and anthraquinones. Among these, p-benzoquinone is preferable from the standpoint of storage stability.

In a method of producing an adduct of a phosphine compound and a quinone compound, an organic tertiary phosphine is brought into contact with a benzoquinone in a solvent that can dissolve both the organic tertiary phosphine and the benzoquinone and mixed to produce an adduct thereof. Any solvent can be used as long as the solubility of the adduct to the solvent is low. Examples of the solvent include, but are not limited to, ketones such as acetone and methyl ethyl ketone.

In the compound represented by general formula (4), each of R7, R8, and R9, all of which are bonded to a phosphorus atom, is preferably a phenyl group, and each of R10, R11, and R12 is preferably a hydrogen atom. That is, a compound produced by adding 1,4-benzoquinone to triphenylphosphine is preferable because the compound decreases the modulus of elasticity during heating of a cured product of the semiconductor-encapsulating resin composition.

Examples of the adducts of a phosphonium compound and a silane compound include compounds represented by general formula (5):

(5)

In general formula (5),

A1 is a nitrogen atom or a phosphorus atom;

Si is a silicon atom;

each of R13, R14, R15, and R16 is an organic group having an aromatic ring or a heterocyclic ring or an aliphatic group, and R13, R14, R15, and R16 may be the same or different;

X2 is an organic group that bonds group Y2 to group Y3;

X3 is an organic group that bonds group Y4 to group Y5;

each of Y2 and Y3 is a group formed when a proton-donating substituent releases a proton, Y2 and Y3 may be the same or different, and group Y2 and group Y3 in the same molecule are bonded to the silicon atom to form a chelate structure;

each of Y4 and Y5 is a group formed when a proton-donating substituent releases a proton, and group Y4 and group Y5 in the same molecule are bonded to the silicon atom to form a chelate structure;

X2 and X3 may be the same or different, and groups Y2, Y3, Y4, and Y5 may be the same or different; and Z1 is an organic group having an aromatic ring or a heterocyclic ring, or an aliphatic group.

In general formula (5), examples of R13, R14, R15, and R16 include a phenyl group, a methylphenyl group, a methoxyphenyl group, a hydroxyphenyl group, a naphthyl group, a hydroxynaphthyl group, a benzyl group, a methyl group, an ethyl group, a n-butyl group, a n-octyl group, and a cyclohexyl group. Among these, aromatic groups having a substituent and unsubstituted aromatic groups, namely, a phenyl group, a methylphenyl group, a methoxyphenyl group, a hydroxyphenyl group, and a hydroxynaphthyl group are more preferred.

In general formula (5), X2 is an organic group that bonds group Y2 to group Y3. Similarly, X3 is an organic group that bonds group Y4 to group Y5. Each of Y2 and Y3 is a group formed when a proton-donating substituent releases a proton, and group Y2 and group Y3 in the same molecule are bonded to the silicon atom to form a chelate structure. Similarly, each of Y4 and Y5 is a group formed when a proton-donating substituent releases a proton, and group Y4 and group Y5 in the same molecule are bonded to the silicon atom to form a chelate structure. X2 and X3 may be the same or different, and groups Y2, Y3, Y4, and Y5 may be the same or different.

Each of the group represented by —Y2-X2-Y3- and the group represented by —Y4-X3-Y5- in general formula (5) is a group formed when a proton donor releases two protons. Examples of the proton donor include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, and glycerin. Among these, catechol, 1,2-dihydroxynaphthalene, and 2,3-dihydroxynaphthalene are more preferable.

In general formula (5), Z1 is an organic group having an aromatic ring or a heterocyclic ring, or an aliphatic group. Specific examples of Z1 include aliphatic groups such as a methyl group, an ethyl group, a propyl group, a butyl group, a hexyl group, and an octyl group; aromatic groups such as a phenyl group, a benzyl group, a naphthyl group, and a biphenyl group; and organic groups having a reactive substituent, such as a glycidyloxypropyl group, a mercaptopropyl group, an aminopropyl group, and a vinyl group. Among these, a methyl group, an ethyl group, a phenyl group, a naphthyl group, and a biphenyl group are more preferable in view of thermal stability.

An adduct of a phosphonium compound and a silane compound can be produced as follows. A silane compound such as phenyltrimethoxysilane and a proton donor such as 2,3-dihydroxynaphthalene are added to methanol in a flask and dissolved. Next, a sodium methoxide-methanol solution is added dropwise thereto under stirring at room temperature. A solution prepared by dissolving a tetrasubstituted phosphonium halide such as tetraphenyl phosphonium bromide in methanol in advance is added to the resulting reaction product dropwise under stirring at room temperature to precipitate crystals. The precipitated crystals are filtered, washed with water, and then dried in vacuum. Thus, an adduct of the phosphonium compound and the silane compound can be produced. However, the method is not limited to this.

The amount of curing accelerator (D) used is preferably 0.1 weight percent or more and 1 weight percent or less of the total weight of the semiconductor-encapsulating resin composition. When the lower limit of the amount of curing accelerator (D) mixed is within the above range, a decrease in curability does not easily occur. When the upper limit of the amount of curing accelerator (D) is within the above range, a decrease in flowability does not easily occur.

The resin composition according to an embodiment of the present invention can contain a silane coupling agent (E). Examples of the silane coupling agent (E) include, but are not limited to, epoxysilanes, aminosilanes, ureidosilanes, and mercaptosilanes. Any silane coupling agent can be used as long as the silane coupling agent is bonded to an epoxy resin and an inorganic filler to increase the interface strength between the epoxy resin and the inorganic filler. Furthermore, by using a compound (F) in which a hydroxyl group is bonded to each of two or more adjacent carbon atoms constituting an aromatic ring (hereinafter also referred to as "compound (F)") described below in combination with this silane coupling agent (E), the minimum ion viscosity obtained when the resulting semiconductor-encapsulating resin composition is measured with a dielectric analyzer is decreased and flowability is improved. In addition, the use of the silane coupling agent (E) is effective to sufficiently achieve the effect of the compound (F). Examples of the epoxysilanes include γ-glycidoxypropyltriethoxysilane, γ-glycidoxypropyltrimethoxysilane, γ-glycidoxypropylmethyldimethoxysilane, and β-(3,4-epoxycyclohexyl)ethyltrimethoxysilane. Examples of the aminosilanes includes γ-aminopropyltriethoxysilane, γ-aminopropyltrimethoxysilane, N-β-(aminoethyl)-γ-aminopropyltrimethoxysilane, N-β-(aminoethyl)-γ-aminopropylmethyldimethoxysilane, N-phenyl-γ-aminopropyltriethoxysilane, N-phenyl-γ-aminopropyltrimethoxysilane, N-β-(aminoethyl)-γ-aminopropyltriethoxysilane, N-6-(aminohexyl)-3-aminopropyltrimethoxysilane, and N-(3-(trimethoxysilylpropyl)-1,3-benzenedimethanane. Examples of the ureidosilanes include γ-ureidopropyltriethoxysilane and hexamethyldisilazane. Examples of mercaptosilanes include γ-mercaptopropyltrimethoxysilane. These silane coupling agents (E) may be used alone or in combinations of two or more compounds.

The amount of silane coupling agent (E) mixed is preferably in the range of 0.01 weight percent or more and 1 weight percent or less, more preferably in the range of 0.05 weight percent or more and 0.8 weight percent or less, and particu- larly preferably in the range of 0.1 weight percent or more and 0.6 weight percent or less of the total weight of the semiconductor-encapsulating resin composition. When the lower limit of the amount of silane coupling agent (E) mixed is within the above range, a semiconductor-encapsulating resin composition having a low viscosity and a high flowability can be obtained by a synergetic effect with the compound (F). When the lower limit of the amount of silane coupling agent (E) mixed is within the above range, a decrease in solder resistance in a semiconductor device due to a decrease in the interface strength between an epoxy resin and an inorganic filler does not easily occur. When the upper limit of the amount of silane coupling agent (E) mixed is within the above range, a decrease in solder resistance due to an increase in the water-absorbing property of a cured product of the semiconductor-encapsulating resin composition does not also easily occur.

The resin composition according to an embodiment of the present invention can contain the compound (F) in which a hydroxyl group is bonded to each of two or more adjacent carbon atoms constituting an aromatic ring. By using the compound (F) in which a hydroxyl group is bonded to each of two or more adjacent carbon atoms constituting an aromatic ring (hereinafter also referred to as "compound (F)"), the minimum ion viscosity obtained when the resulting semiconductor-encapsulating resin composition is measured with a dielectric analyzer can be decreased and flowability can be improved. Examples of the compound (F) include monocyclic compounds represented by general formula (7) below and polycyclic compounds represented by general formula (8) below. These compounds may have a substituent other than a hydroxyl group.

(7)

In general formula (7),
one of R17 and R21 is a hydroxyl group; when one is a hydroxyl group, the other is a hydrogen atom, a hydroxyl group, or a substituent other than a hydroxyl group; and
each of R18, R19, and R20 is a hydrogen atom, a hydroxyl group, or a substituent other than a hydroxyl group.

(8)

In general formula (8),
one of R22 and R28 is a hydroxyl group; when one is a hydroxyl group, the other is a hydrogen atom, a hydroxyl group, or a substituent other than a hydroxyl group; and
each of R23, R24, R25, R26, and R27 is a hydrogen atom, a hydroxyl group, or a substituent other than a hydroxyl group.

Specific examples of the monocyclic compounds represented by general formula (7) include catechol, pyrogallol, gallic acid, gallates, and derivatives thereof. Specific examples of the polycyclic compounds represented by general formula (8) include 1,2-dihydroxynaphthalene, 2,3-dihydroxynaphthalene, and derivatives thereof. Among these, from the standpoint of the ease of control of flowability and curability, compounds in which a hydroxyl group is bonded to each of two adjacent carbon atoms constituting an aromatic ring are preferable. In addition, considering volatilization in a step of kneading, compounds having, as a mother nucleus, a naphthalene ring, which has low volatility and high weighing stability, are more preferable. In this case, specific examples of the compound (F) can include compounds having a naphthalene ring such as 1,2-dihydroxynaphthalene, 2,3-dihydroxynaphthalene, and derivatives thereof. These compounds (F) may be used alone or in combinations of two or more compounds.

The amount of compound (F) mixed is preferably in the range of about 0.01 weight percent or more and about 1 weight percent or less, more preferably in the range of about 0.03 weight percent or more and about 0.8 weight percent or less, and particularly preferably in the range of about 0.05 weight percent or more and about 0.5 weight percent or less of the total weight of the semiconductor-encapsulating resin composition. When the lower limit of the amount of compound (F) mixed is within the above range, a semiconductor-encapsulating resin composition having a low viscosity and a high flowability can be obtained by a synergetic effect with the silane coupling agent (E). When the upper limit of the amount of compound (F) mixed is within the above range, a decrease in curability and a degradation of physical properties of a cured product of the semiconductor-encapsulating resin composition do not easily occur.

The resin composition according to the embodiment of the present invention can further contain an inorganic filler (G). Inorganic fillers that are generally used in a semiconductor-encapsulating resin composition can be used as the inorganic filler (G). Examples of such inorganic fillers include fused silica, spherical silica, crystalline silica, alumina, silicon nitride, and aluminum nitride. In view of the filling property in a mold, the particle diameter of the inorganic filler (G) is preferably about 0.01 μm or more and about 150 μm or less.

The amount of inorganic filler (G) mixed is preferably in the range of about 80 weight percent or more and about 92 weight percent or less, more preferably in the range of about 82 weight percent or more and about 91 weight percent or less, and particularly preferably in the range of about 84 weight percent or more and about 90 weight percent or less of the total weight of the semiconductor-encapsulating resin composition. When the lower limit of the content of the inorganic filler (G) is within the above range, a decrease in solder resistance due to a decrease in the strength caused by an increase in the amount of water absorption of a cured product of the semiconductor-encapsulating resin composition does not easily occur. When the upper limit of the content of the inorganic filler (G) is within the above range, a problem in molding due to a degradation of flowability does not easily occur.

In addition to the above components (A) to (G), the semiconductor-encapsulating resin composition according to the embodiment of the present invention can optionally contain a mold-releasing agent such as natural wax, e.g., carnauba wax, synthetic wax, e.g., polyethylene wax, a higher fatty acid or a metal salt thereof, e.g., stearic acid or zinc stearate, or paraffin; a coloring agent such as carbon black or colcothar; a low-stress additive, e.g., silicone oil or silicone rubber; an inorganic ion-exchanger, e.g., bismuth oxide hydrate; and a flame retardant, e.g., a metal hydroxide, namely, aluminum hydroxide or magnesium hydroxide, zinc borate, zinc molybdate, or a phosphazene.

The semiconductor-encapsulating resin composition according to the embodiment of the present invention can be obtained by, for example, uniformly mixing the above components (A) to (G), other additives, and the like using a mixer or the like at room temperature, subsequently, as needed, melt-kneading the mixture using a kneading machine such as a heating roller, a kneader, or an extruder, and then cooling and crushing the resulting mixture. The degree of dispersion and flowability of the resin composition may be adjusted according to need.

A semiconductor device can be produced by encapsulating a semiconductor element with a cured product of the semiconductor-encapsulating resin composition according to the embodiment of the present invention as follows. For example, a lead frame or the like having the semiconductor element thereon is placed in a mold cavity. Subsequently, the resin composition according to the embodiment of the present invention is molded by a molding method such as transfer molding, compression molding, or injection molding, and then cured.

Examples of the semiconductor element to be encapsulated in the embodiment of the present invention include, but are not particularly limited to, an integrated circuit, a large-scale integrated circuit, a transistor, a thyristor, a diode, and a solid-state image pickup element.

Examples of the form of the semiconductor device according to the embodiment of the present invention include, but are not particularly limited to, a dual inline package (DIP), a plastic leaded chip carrier (PLCC), a quad flat package (QFP), a small outline package (SOP), a small outline J-leaded package (SOJ), a thin small outline package (TSOP), a thin quad flat package (TQFP), a tape carrier package (TCP), a ball grid array (BGA), and a chip size package (CSP).

The semiconductor device encapsulated by a molding method such as transfer molding is mounted on an electronic device or the like without further treatment or after completely being cured at a temperature in the range of about 120° C. to 200° C. for about 10 minutes to 10 hours.

Figure 2:
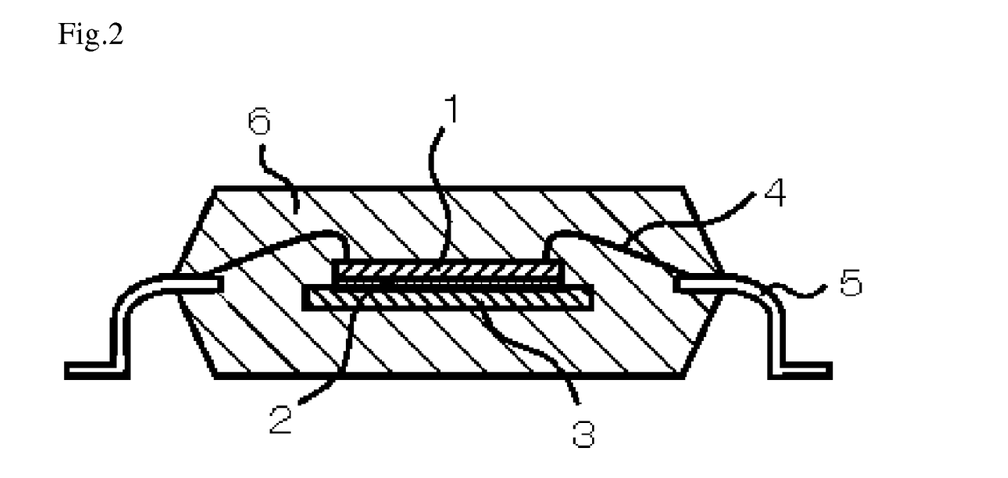
FIG. 2 is a view showing the cross-sectional structure of an example of a semiconductor device including a semiconductor-encapsulating resin composition according to an embodiment of the present invention.

FIG. 2 is a view showing the cross-sectional structure of an example of a semiconductor device including a semiconductor-encapsulating resin composition according to the embodiment of the present invention. A semiconductor element 1 is fixed on a die pad 3, with a cured die-bonding material 2 therebetween. Each of electrode pads of the semiconductor element 1 is connected to a lead frame 5 using a gold wire 4. The semiconductor element 1 is encapsulated with a cured product 6 of a resin composition for encapsulating.

The embodiment of the present invention will now be described specifically using examples, but the present invention is not limited to the examples. The amounts mixed are given in parts by weight.

Methods of synthesizing Compound B2 and Compound B6 will now be described as examples of a method of synthesizing the compound (B) represented by general formula (1) used in an embodiment of the present invention. Other compounds (B) represented by general formula (1) can also be similarly produced.

Synthesis of Compound B2

First, 940 g (10 moles) of phenol and 581 g (2.4 moles) of bis(methoxymethyl)biphenyl were fed into a reactor equipped with a stirrer, a thermometer, and a condenser, and 0.9 g of diethyl sulfate was added thereto. The reaction solution was allowed to react for two hours while the reaction temperature was kept at 175° C. Methanol produced during this reaction was distilled off. Subsequently, 0.9 g of oxalic acid was added to the reaction solution, and 60 g (0.6 moles in terms of formaldehyde) of a 30% aqueous solution of formaldehyde was added thereto. The reaction solution was further refluxed under heating for 1.5 hours. After the completion of reaction, the reaction solution was cooled and washed with water three times. The oil layer was separated, and unreacted phenol was then distilled off under reduced pressure. Thus, 550 g of Compound B2 was obtained. According to the results of analysis by GPC and NMR, resulting Compound B2 was a compound in which —$Ar_1$— was a phenylene group, —$Ar_2$— was a biphenylene group, X was a hydrogen atom, k was 0, and l was 0 in general formula (1), and the ratio of the area of a component in which m≠0 and n≠0 to the total area of the compound (B) in a GPC chart was 10%, and the ratio of the area of a component in which m=0 and n=0 to the total area of the compound (B) in the GPC chart was 4%. The resulting Compound B2 had a hydroxyl equivalent of 190 g/eq, a softening point of 62° C., and an ICI viscosity of 0.5 dPa·s at 150° C.

Synthesis of Compound B6

First, 1,700 g (10 moles) of p-phenylphenol and 398 g (2.34 moles) of p-xylylene glycol dimethyl ether were fed into a reactor equipped with a stirrer, a thermometer, and a condenser, and 1.7 g of diethyl sulfate was added thereto. The reaction solution was allowed to react for two hours while the reaction temperature was kept at 175° C. Methanol produced during this reaction was distilled off. Subsequently, 1.7 g of oxalic acid was added to the reaction solution, and 60 g (0.6 moles in terms of formaldehyde) of a 30% aqueous solution of formaldehyde was added thereto. The reaction solution was further refluxed under heating for 1.5 hours. After the completion of reaction, the reaction solution was cooled and washed with water three times. The oil layer was separated, and unreacted p-phenylphenol was then distilled off under reduced pressure. Thus, 1,000 g of Compound B6 was obtained. According to the results of analysis by GPC and NMR, resulting Compound B6 was a compound in which —$Ar_1$— was a phenylphenylene group, —$Ar_2$— was a phenylene group, X was a hydrogen atom, k was 0, and l was 0 in general formula (1), and the ratio of the area of a component in which m≠0 and n≠0 to the total area of the compound (B) in a GPC chart was 30%, and the ratio of the area of a component in which m=0 and n=0 to the total area of the compound (B) in the GPC chart was 10%. The resulting Compound B6 had a hydroxyl equivalent of 250 g/eq, a softening point of 85° C., and an ICI viscosity of 2.0 dPa·s at 150° C.

Information on the structures, the compositions, resin characteristics, and the like of the compound (B) represented by general formula (1) and the compound (C) having two or more phenolic hydroxyl groups used in examples and comparative examples are summarized in Table 1.

In addition, an anti-blocking property of the compound (B) and the compound (C) evaluated by a method described below are also shown in Table 1.

Anti-blocking property of compound (B) and compound (C): One hundred grams of a granular compound (B) or compound (C) are charged in a polypropylene cup having an opening diameter of 7.5 cm and a height of 8.0 cm, and the compound was left to stand at 25° C. for one hour. The compound (B) or the compound (C) was then taken out from the cup. When the state of the compound had returned to its initial granular state, the compound was evaluated as "☉". When the compound became block-like and maintained the shape of the cup, but could be easily loosened by hand, the compound was evaluated as "◉". When the compound became block-like and maintained the shape of the cup, and could not be loosened by hand, the compound was evaluated as "x".

The minimum ion viscosity was measured in accordance with ASTM E2039 by the following method. About 3 g of powdery epoxy resin composition was introduced onto the top surface of an electrode portion in the press at a measurement temperature of 175° C. and at a measurement frequency

TABLE 1

| | $Ar_1$ | $Ar_2$ | m ≠ 0, n ≠ 0 % | m = 0, n = 0 % | X | R1 | k | R2 | l | Softening point ° C. | ICI viscosity dPa·s | Hydroxyl equivalent g/eq | Anti-blocking property |
|---|---|---|---|---|---|---|---|---|---|---|---|---|---|
| Compound B1 | Phenylene | Biphenylene | 17 | 13 | Hydrogen | — | 0 | — | 0 | 58 | 0.4 | 153 | ◉ |
| Compound B2 | Phenylene | Biphenylene | 10 | 4 | Hydrogen | — | 0 | — | 0 | 62 | 0.5 | 190 | ◉ |
| Compound B3 | Phenylene | Biphenylene | 23 | 25 | Hydrogen | — | 0 | — | 0 | 55 | 0.2 | 116 | ○ |
| Compound B4 | Phenylene | Phenylene | 55 | 1 | Phenyl | — | 0 | — | 0 | 73 | 0.3 | 146 | ◉ |
| Compound B5 | Phenylene | Biphenylene | 30 | 2 | Phenyl | — | 0 | — | 0 | 72 | 0.6 | 180 | ◉ |
| Compound B6 | Phenylphenylene | Phenylene | 30 | 10 | Hydrogen | — | 0 | — | 0 | 85 | 2.0 | 250 | ◉ |
| Compound C1 | Phenol novolak resin (PR-HF-3, manufactured by Sumitomo Bakelite Co., Ltd.) | | | | | | | | | 80 | 1.0 | 104 | ◉ |
| Compound C2 | Naphthol aralkyl resin having phenylene structure (SN-485, manufactured by Tohto Kasei Co., Ltd.) | | | | | | | | | 85 | 1.8 | 210 | ◉ |
| Compound C3 | Phenol novolak resin (PR-51714, manufactured by Sumitomo Bakelite Co., Ltd.) | | | | | | | | | 90 | 1.6 | 105 | ◉ |
| Compound C4 | Triphenolmethane-type phenolic resin (MEH-7500, manufactured by Meiwa Plastic Industries, Ltd.) | | | | | | | | | 110 | 5.8 | 203 | ◉ |

EXAMPLE 1

| | |
|---|---|
| Epoxy resin 1: Phenol-aralkyl-type epoxy resin having biphenylene structure (NC-3000, manufactured by Nippon Kayaku Co., Ltd., epoxy equivalent: 274, softening point: 58° C.) | 7.57 parts by weight |
| Compound B1 | 4.23 parts by weight |
| Curing accelerator 1: Triphenylphosphine | 0.20 parts by weight |
| Silane coupling agent 1: γ-Glycidoxypropyltrimethoxysilane | 0.30 parts by weight |
| 2,3-Dihydroxynaphthalene | 0.20 parts by weight |
| Fused spherical silica (average particle diameter: 30 μm) | 87.00 parts by weight |
| Carnauba wax | 0.20 parts by weight |
| Carbon black | 0.30 parts by weight |

The above components were mixed with a mixer at room temperature. The mixture was melt-kneaded with a heating roller at 80° C. or higher and 100° C. or lower, cooled, and then crushed. Thus, an epoxy resin composition was obtained. The prepared epoxy resin composition was evaluated by the following methods. The evaluation results are shown in Table 2.

Spiral flow: The epoxy resin composition was transferred into a mold for a spiral flow measurement in accordance with EMMI-1-66 at a mold temperature of 175° C., at an transfer pressure of 6.9 MPa, and with a curing time of 120 seconds using a low-pressure transfer molding machine (KTS-15, manufactured by Kohtaki Precision Machine Co., Ltd.) to measure the flow length. The spiral flow is a parameter of flowability, and a larger value of the spiral flow means better flowability. The spiral flow is given in units of centimeters (cm).

Minimum ion viscosity: A DEA231/1 cure analyzer manufactured by NETZSCH was used as a dielectric analyzer. An MP235 Mini-Press manufactured by NETZSCH was used as a press.

of 100 Hz, and pressed. The viscosity of the resin composition was measured with time. The value of the minimum ion viscosity in the measurement is shown. The minimum ion viscosity is a parameter related to flowability, and a smaller value means better flowability. The minimum ion viscosity has no units.

Maximum slope: A DEA231/1 cure analyzer manufactured by NETZSCH was used as a dielectric analyzer. An MP235 Mini-Press manufactured by NETZSCH was used as a press.

The maximum slope was measured in accordance with ASTM E2039 by the following method. About 3 g of powdery epoxy resin composition was introduced onto the top surface of an electrode portion in the press at a measurement temperature of 175° C. and at a measurement frequency of 100 Hz, and pressed, and the maximum slope was measured. The value of the maximum slope in the measurement is shown. The maximum slope is a parameter related to curability, and a larger value means better curability. The maximum slope has no units.

Gold wire sweeping ratio: The epoxy resin composition was transferred at a mold temperature of 175° C., at an transfer time of 10 seconds, at a curing time of 90 seconds, and at an transfer pressure of 9.8 MPa using a low-pressure transfer molding machine to perform encapsulation molding of, for example, a lead frame on which a silicon chip is mounted. Thus, a 208-pin QFP having a body size of 28 mm×28 mm×3.2 mm (a frame in which a silicon (Si) chip having dimensions of 10 mm×10 mm×0.35 mm was adhered on a copper (Cu) frame and bonded by gold wire bonding; average gold wire length: 4 mm) was prepared. The prepared package was observed with a soft X-ray fluoroscope (PRO-TEST 100, manufactured by Softex Co., Ltd.), and the gold wire sweeping ratio was represented by a ratio of (amount of sweeping)/(gold wire length). The gold wire sweeping ratio is given in units of percent (%).

Flame resistance: The epoxy resin composition was transfer molded at a mold temperature of 175° C., at an transfer pressure of 9.8 MPa, at an transfer time of 15 seconds, and at a curing time of 120 seconds using a low-pressure transfer molding machine (KTS-30, manufactured by Kohtaki Precision Machine Co., Ltd.) to prepare flame-resistance test pieces having a thickness of 3.2 mm and 1.6 mm. The prepared test pieces were post-cured at 175° C. for eight hours. A flame resistance test was performed in accordance with a standard specified in the UL-94 vertical method to evaluate flame resistance. The levels of flame resistance after the evaluation are shown in the table below.

Solder resistance 1: The epoxy resin composition was transferred at a mold temperature of 180° C., at an transfer pressure of 7.4 MPa, and at a curing time of 120 seconds using a low-pressure transfer molding machine (GP-ELF, manufactured by Dai-ichi Seiko Co., Ltd.) to perform encapsulation molding of, for example, a lead frame on which a silicon chip was mounted. Thus, 80p-QFPs (copper (Cu) lead frame, package size: 14 mm×20 mm×2.00 mm (thickness), silicon chip size: 7 mm×7 mm×0.35 mm (thickness), the chip being bonded to bonding pads of a circuit board using a gold wire having a diameter of 25 μm) were prepared. The prepared six packages were post-cured by being heat-treated at 175° C. for four hours. A humidification process was performed on the six packages at 85° C. and a relative humidity of 60% for 168 hours. An IR reflow process (at 260° C., in accordance with the condition of JEDEC Level 2) was then performed. The presence or absence of detachment and cracks inside the packages after the processes was observed with a scanning acoustic tomograph (mi-scope 10, manufactured by Hitachi Kenki Fine Tech Co., Ltd.). Packages in which at least one of detachment or a crack was generated were evaluated as defective. When the number of defective packages was n, the result was shown as n/6.

Solder resistance 2: The epoxy resin composition was transferred at a mold temperature of 175° C., at an transfer pressure of 9.6 MPa, and at a curing time of 90 seconds using a low-pressure transfer molding machine (GP-ELF, manufactured by Dai-ichi Seiko Co., Ltd.) to perform encapsulation molding of, for example, a lead frame on which a silicon chip was mounted. Thus, 176p-LQFPs (copper (Cu) frame, package size: 24 mm×24 mm×1.4 mm (thickness), pad size: 9.5 mm×9.5 mm, silicon chip size: 7 mm×7 mm×0.35 mm (thickness), the chip being bonded to bonding pads of a circuit board using a gold wire having a diameter of 25 μm) were prepared. Post-cure was performed at 175° C. for four hours. A humidification process of the prepared 16 package samples was performed at 85° C. and a relative humidity of 85% for 168 hours. An IR reflow process (at 260° C., in accordance with the condition of JEDEC Level 2) was then performed. The presence or absence of detachment and cracks inside the packages after the processes was observed with a scanning acoustic tomograph (mi-scope 10, manufactured by Hitachi Kenki Fine Tech Co., Ltd.). Packages in which at least one of detachment or a crack was generated were evaluated as defective. When the number of defective packages was n, the result was shown as n/16.

EXAMPLES 2 TO 24 AND COMPARATIVE EXAMPLES 1 TO 3

Epoxy resin compositions were produced as in Example 1 in accordance with the mixing ratios shown in Tables 2, 3, and 4 and evaluated as in Example 1. The evaluation results are shown in Table 2, 3, and 4.

Components used in the examples and the comparative examples except for Example 1 were as follows.

Epoxy resin 2: Biphenyl-type crystalline epoxy resin (YX4000K, manufactured by Japan Epoxy Resins Co., Ltd., epoxy equivalent: 185, melting point: 105° C.)

Epoxy resin 3: Dihydroanthraquinone-type crystalline epoxy resin (YX8800, manufactured by Japan Epoxy Resins Co., Ltd., epoxy equivalent: 181, melting point: 109° C.)

Epoxy resin 4: Triphenolmethane-type epoxy resin (E-1032H60, manufactured by Japan Epoxy Resins Co., Ltd., epoxy equivalent: 171, softening point: 60° C.)

Curing accelerator 2: 1,8-Diazabicyclo(5,4,0)undecene-7

Curing accelerator 3: Curing accelerator represented by formula (9) below:

Curing accelerator 4: Curing accelerator represented by formula (10) below:

Curing accelerator 5: Curing accelerator represented by formula (11) below:

Curing accelerator 6: Curing accelerator represented by formula (12) below:

Silane coupling agent 2: γ-mercaptopropyltrimethoxysilane 1,2-dihydroxynaphthalene Catechol Pyrogallol

TABLE 2

|  |  | Examples | | | | | | |
| --- | --- | --- | --- | --- | --- | --- | --- | --- |
|  |  | 1 | 2 | 3 | 4 | 5 | 6 | 7 |
| Epoxy resin 1 |  | 7.57 | 6.97 | 8.29 | 7.70 | 7.12 | 6.17 | 7.92 |
| Epoxy resin 2 |  |  |  |  |  |  |  |  |
| Epoxy resin 3 |  |  |  |  |  |  |  |  |
| Compound B1 |  | 4.23 |  |  |  |  |  | 2.71 |
| Compound B2 |  |  | 4.83 |  |  |  |  |  |
| Compound B3 |  |  |  | 3.51 |  |  |  |  |
| Compound B4 |  |  |  |  | 4.10 |  |  |  |
| Compound B5 |  |  |  |  |  | 4.68 |  |  |
| Compound B6 |  |  |  |  |  |  | 5.63 |  |
| Compound C1 |  |  |  |  |  |  |  | 1.16 |
| Compound C2 |  |  |  |  |  |  |  |  |
| Curing accelerator 1 |  | 0.20 | 0.20 | 0.20 | 0.20 | 0.20 | 0.20 | 0.20 |
| Curing accelerator 2 |  |  |  |  |  |  |  |  |
| Curing accelerator 3 |  |  |  |  |  |  |  |  |
| Curing accelerator 4 |  |  |  |  |  |  |  |  |
| Curing accelerator 5 |  |  |  |  |  |  |  |  |
| Silane coupling agent 1 |  | 0.30 | 0.30 | 0.30 | 0.30 | 0.30 | 0.30 | 0.30 |
| 2,3-dihydroxynaphthalene |  | 0.20 | 0.20 | 0.20 | 0.20 | 0.20 | 0.20 | 0.20 |
| Fused spherical silica |  | 87.00 | 87.00 | 87.00 | 87.00 | 87.00 | 87.00 | 87.00 |
| Carnauba wax |  | 0.20 | 0.20 | 0.20 | 0.20 | 0.20 | 0.20 | 0.20 |
| Carbon black |  | 0.30 | 0.30 | 0.30 | 0.30 | 0.30 | 0.30 | 0.30 |
| Spiral flow [cm] |  | 128 | 113 | 142 | 118 | 111 | 108 | 140 |
| Minimum ion viscosity | Appearance time [sec] | 15 | 12 | 19 | 12 | 11 | 10 | 19 |
|  | Ion viscosity [−] | 5.9 | 6.0 | 5.7 | 6.0 | 6.1 | 6.1 | 5.5 |
| Maximum slope | Appearance time [sec] | 30 | 25 | 39 | 29 | 24 | 23.0 | 38.0 |
|  | Maximum slope [−] | 2.7 | 2.6 | 3.0 | 2.8 | 2.7 | 2.7 | 3.1 |
| Gold wire sweeping ratio [%] |  | 2.5 | 2.6 | 2.2 | 2.9 | 2.9 | 2.8 | 2.2 |
| Flame resistance (UL-94) | 3.2 mm in thickness | V-0 | V-0 | V-0 | V-0 | V-0 | V-0 | V-0 |
|  | 1.6 mm in thickness | V-0 | V-1 | V-0 | V-0 | V-0 | V-0 | V-0 |
| Solder resistance 1 (The number of defective packages among 6 packages) [n/6] |  | 0/6 | 0/6 | 0/6 | 0/6 | 0/6 | 0/6 | 0/6 |
| Solder resistance 2 (The number of defective packages among 16 packages) [n/16] |  | 0/16 | 0/16 | 0/16 | 3/16 | 0/16 | 3/16 | 0/16 |

|  |  | Example | | | | | | |
| --- | --- | --- | --- | --- | --- | --- | --- | --- |
|  |  | 8 | 9 | 10 | 11 | 12 | 13 | 14 |
| Epoxy resin 1 |  | 7.34 |  |  | 7.92 | 7.92 | 7.92 | 7.79 |
| Epoxy resin 2 |  |  | 6.46 |  |  |  |  |  |
| Epoxy resin 3 |  |  |  | 6.40 |  |  |  |  |
| Compound B1 |  | 3.12 | 5.34 | 5.41 | 2.71 | 2.71 | 2.71 | 2.67 |
| Compound B2 |  |  |  |  |  |  |  |  |
| Compound B3 |  |  |  |  |  |  |  |  |
| Compound B4 |  |  |  |  |  |  |  |  |
| Compound B5 |  |  |  |  |  |  |  |  |
| Compound B6 |  |  |  |  |  |  |  |  |
| Compound C1 |  |  |  |  | 1.16 | 1.16 | 1.16 | 1.14 |
| Compound C2 |  | 1.34 |  |  |  |  |  |  |
| Curing accelerator 1 |  | 0.20 | 0.20 | 0.20 |  |  |  |  |
| Curing accelerator 2 |  |  |  |  | 0.20 |  |  |  |
| Curing accelerator 3 |  |  |  |  |  | 0.20 |  |  |
| Curing accelerator 4 |  |  |  |  |  |  | 0.20 |  |
| Curing accelerator 5 |  |  |  |  |  |  |  | 0.40 |
| Silane coupling agent 1 |  | 0.30 | 0.30 | 0.30 | 0.30 | 0.30 | 0.30 | 0.30 |
| 2,3-dihydroxynaphthalene |  | 0.20 | 0.20 | 0.20 | 0.20 | 0.20 | 0.20 | 0.20 |
| Fused spherical silica |  | 87.00 | 87.00 | 87.00 | 87.00 | 87.00 | 87.00 | 87.00 |
| Carnauba wax |  | 0.20 | 0.20 | 0.20 | 0.20 | 0.20 | 0.20 | 0.20 |
| Carbon black |  | 0.30 | 0.30 | 0.30 | 0.30 | 0.30 | 0.30 | 0.30 |
| Spiral flow [cm] |  | 101 | 172 | 160 | 113 | 130 | 148 | 165 |
| Minimum ion viscosity | Appearance time [sec] | 9 | 26 | 25 | 11 | 16 | 21 | 26 |
|  | Ion viscosity [−] | 6.3 | 5.4 | 5.7 | 6.2 | 5.8 | 5.6 | 5.4 |

TABLE 2-continued

| Maximum slope | Appearance time [sec] | 20.00 | 53.0 | 48.0 | 26.0 | 34.0 | 42.0 | 50.0 |
|---|---|---|---|---|---|---|---|---|
| | Maximum slope [−] | 2.6 | 2.3 | 2.5 | 2.8 | 2.8 | 3.0 | 3.3 |
| Gold wire sweeping ratio [%] | | 2.9 | 2.2 | 2.5 | 2.7 | 2.3 | 2.2 | 2.0 |
| Flame resistance(UL-94) | 3.2 mm in thickness | V-0 | V-0 | V-0 | V-0 | V-0 | V-0 | V-0 |
| | 1.6 mm in thickness | V-0 | V-1 | V-0 | V-0 | V-0 | V-0 | V-0 |
| Solder resistance 1 (The number of defective packages among 6 packages) [n/6] | | 0/6 | 0/6 | 0/6 | 0/6 | 0/6 | 0/6 | 0/6 |
| Solder resistance 2 (The number of defective packages among 16 packages) [n/16] | | 0/16 | 3/16 | 4/16 | 0/16 | 0/16 | 0/16 | 0/16 |

TABLE 3

| | | Examples | | | | | | | | | |
|---|---|---|---|---|---|---|---|---|---|---|---|
| | | 15 | 16 | 17 | 18 | 19 | 20 | 21 | 22 | 23 | 24 |
| Epoxy resin 1 | | 7.92 | 7.92 | 7.92 | 7.92 | 8.05 | 7.92 | 8.12 | 7.59 | 9.94 | 5.91 |
| Epoxy resin 2 | | | | | | | | | | | |
| Epoxy resin 4 | | | | | | | | | | | |
| Compound B1 | | 2.71 | 2.71 | 2.71 | 2.71 | 2.76 | 2.71 | 2.78 | 2.60 | 3.40 | 2.02 |
| Compound C1 | | 1.16 | 1.16 | 1.16 | 1.16 | 1.18 | 1.16 | 1.19 | 1.11 | 1.46 | 0.87 |
| Compound C2 | | | | | | | | | | | |
| Compound C3 | | | | | | | | | | | |
| Compound C4 | | | | | | | | | | | |
| Curing accelerator 1 | | | 0.20 | 0.20 | 0.20 | 0.20 | 0.20 | 0.20 | 0.20 | 0.20 | 0.20 |
| Curing accelerator 6 | | 0.20 | | | | | | | | | |
| Silane coupling agent 1 | | 0.30 | 0.30 | 0.30 | 0.30 | 0.30 | | 0.01 | 0.80 | 0.30 | 0.30 |
| Silane coupling agent 2 | | | | | | | 0.30 | | | | |
| 2,3-dihydroxynaphthalene | | 0.20 | | | | 0.01 | 0.20 | 0.20 | 0.20 | 0.20 | 0.20 |
| 1,2-dihydroxynaphthalene | | | 0.20 | | | | | | | | |
| Catechol | | | | 0.20 | | | | | | | |
| Pyrogallol | | | | | 0.20 | | | | | | |
| Fused spherical silica | | 87.00 | 87.00 | 87.00 | 87.00 | 87.00 | 87.00 | 87.00 | 87.00 | 84.00 | 90.00 |
| Carnauba wax | | 0.20 | 0.20 | 0.20 | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 | 0.30 | 0.30 | 0.30 |
| Spiral flow [cm] | | 129 | 110 | 108 | 107 | 123 | 135 | 106 | 135 | 142 | 96 |
| Minimum ion viscosity | Appearance time [sec] | 16 | 11 | 11 | 11 | 14 | 18 | 10 | 17 | 18 | 7 |
| | Ion viscosity [−] | 5.9 | 6.2 | 6.2 | 6.2 | 6.0 | 5.8 | 6.1 | 5.7 | 5.7 | 6.3 |
| Maximum slope | Appearance time [sec] | 32.0 | 24.0 | 23.0 | 21.0 | 30.0 | 35.0 | 22.0 | 36.0 | 39.0 | 16.0 |
| | Maximum slope [−] | 2.8 | 2.8 | 2.8 | 2.8 | 2.7 | 2.9 | 2.7 | 2.7 | 2.7 | 3.0 |
| Gold wire sweeping ratio [%] | | 2.5 | 2.7 | 2.8 | 2.7 | 2.5 | 2.6 | 2.7 | 2.7 | 2.3 | 3.1 |
| Flame resistance (UL-94) | 3.2 mm in thickness | V-0 | V-0 | V-0 | V-0 | V-0 | V-0 | V-0 | V-0 | V-0 | V-0 |
| | 1.6 mm in thickness | V-0 | V-0 | V-0 | V-0 | V-0 | V-0 | V-0 | V-0 | V-0 | V-0 |
| Solder resistance 1 (The number of defective packages among 6 packages) [n/6] | | 0/6 | 0/6 | 0/6 | 0/6 | 0/6 | 0/6 | 0/6 | 0/6 | 0/6 | 0/6 |
| Solder resistance 2 (The number of defective packages among 16 packages) [n/16] | | 0/16 | 0/16 | 0/16 | 0/16 | 0/16 | 0/16 | 0/16 | 0/16 | 0/16 | 0/16 |

TABLE 4

| | Comparative examples | | |
|---|---|---|---|
| | 1 | 2 | 3 |
| Epoxy resin 1 | 8.57 | | |
| Epoxy resin 2 | | | 5.60 |
| Epoxy resin 3 | | | |
| Epoxy resin 4 | | 7.47 | |
| Compound B1 | | | |
| Compound B2 | | | |
| Compound B3 | | | |
| Compound B4 | | | |

TABLE 4-continued

|  | Comparative examples | | |
|---|---|---|---|
|  | 1 | 2 | 3 |
| Compound B5 | | | |
| Compound B6 | | | |
| Compound C1 | | | |
| Compound C2 | | | 6.35 |
| Compound C3 | 3.23 | | |
| Compound C4 | | 4.24 | |
| Curing accelerator 1 | 0.20 | 0.30 | 0.05 |
| Curing accelerator 2 | | | |
| Curing accelerator 3 | | | |
| Curing accelerator 4 | | | |
| Curing accelerator 5 | | | |
| Curing accelerator 6 | | | |
| Silane coupling agent 1 | 0.30 | 0.30 | 0.30 |
| Silane coupling agent 2 | | | |
| 2,3-dihydroxynaphthalene | 0.20 | 0.20 | 0.20 |
| 1,2-dihydroxynaphthalene | | | |
| Catechol | | | |
| Pyrogallol | | | |
| Fused spherical silica | 87.00 | 87.00 | 87.00 |
| Carnauba wax | 0.20 | 0.20 | 0.20 |
| Carbon black | 0.30 | 0.30 | 0.30 |
| Spiral flow [cm] | 59 | 40 | 190 |
| Minimum ion viscosity Appearance time [sec] | 5 | 3 | 41 |
| Ion viscosity [−] | 8.5 | 10.1 | 5.5 |
| Maximum slope Appearance time [sec] | 14.0 | 11.8 | 72.0 |
| Maximum slope [−] | 4.1 | 4.4 | 1.5 |
| Gold wire sweeping ratio [%] | 5.1 | 7.8 | 2.2 |
| Flame resistance  3.2 mm in thickness | V-1 | Burnout | Burnout |
| (UL-94)  1.6 mm in thickness | V-2 | Burnout | Burnout |
| Solder resistance 1 (The number of defective packages among 6 packages) [n/6] | 2/6 | 6/6 | 5/6 |
| Solder resistance 2 (The number of defective packages among 16 packages) [n/16] | 15/16 | 16/16 | 14/16 |

When the resin compositions of Examples 1 to 24 were measured using a dielectric analyzer under the conditions of a measurement temperature of 175° C. and a measurement frequency of 100 Hz, the minimum ion viscosity appeared after 5 seconds or more and 40 seconds or less from the start of the measurement, the value of the minimum ion viscosity was 4.0 or more and 7.0 or less, the maximum slope appeared after 10 seconds or more and 60 seconds or less from the start of the measurement, and the value of the maximum slope was 2.0 or more and 6.0 or less. Accordingly, all the compositions of the examples had an excellent balance of flowability (the spiral flow and the minimum ion viscosity) and curability (the maximum slope), and satisfactory gold wire sweeping ratios. In addition, satisfactory flame resistance and solder resistance could also be achieved in Examples 1 to 24.

According to the embodiment of the present invention, a semiconductor-encapsulating resin composition that can realize a combination of excellent flowability with high curability, which are usually incompatible properties, can be obtained. Therefore, the semiconductor-encapsulating resin composition according to the embodiment of the present invention is suitable for use in a surface-mount semiconductor device.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A semiconductor-encapsulating resin composition comprising:

a compound (A) having two or more glycidyl ether groups; and a compound (B) represented by general formula (6)

(6)

wherein —$Ar_1$— is a group selected from a phenylene group, a 1-napthylene group, a 2-naphthylene group, an oxybiphenylene group, and a biphenylene group;

—$Ar_2$— is a group selected from a phenylene group, a biphenlyene group, and a naphthylene group;

however, the case where both —$Ar_1$— and —$Ar_2$— are phenylene groups is eliminated;

X is a hydrogen atom or an organic group that has 1 to 20 carbon atoms and that may have a hydroxyl group, each of substituents R1 introduced in —$Ar_1$— is an organic group having 1 to 20 carbon atoms, and substituents R1 may be the same or different;

each of substituents R2 introduced in —$Ar_2$— is an alkyl group having 1 to 4 carbon atoms, and substituents R2 may be the same or different;

k is an integer in the range of 0 to 7;

l is an integer in the range of 0 to 8; and each of the averages of p and q is a positive number more than 0 and less than 10.

2. The semiconductor-encapsulating resin composition according to claim 1, wherein in the compound (B), —$Ar_1$— is a phenylene group, —$Ar_2$— is a biphenylene group, and X is a hydrogen atom or an aromatic group having 6 to 20 carbon atoms.

3. The semiconductor-encapsulating resin composition according to claim 1, wherein the compound (B) has an ICI viscosity of at least about 0.10 dPa·s and at most about 2.0 dPa·s at 150° C. and a softening point of about 50° C. or higher and about 90° C. or lower.

4. The semiconductor-encapsulating resin composition according to claim 1, wherein when ion viscosity of the resin composition is measured under conditions of a measurement temperature of about 175° C. and a measurement frequency of about 100 Hz, minimum ion viscosity appears at about 5 seconds or later and within about 40 seconds from a measurement starting point, the minimum ion viscosity is at least about 4.0 and at most about 7.0, a maximum slope of the ion viscosity appears at about 10 seconds or later and within about 60 seconds from the measurement starting point, and the maximum slope is at least about 2.0 and at most about 6.0.

5. The semiconductor-encapsulating resin composition according to claim 1, wherein the resin composition does not contain a halogen flame retardant and a heavy-metal flame retardant, and wherein flame resistance of a cured product of the resin composition measured by UL-94 vertical method satisfies V-0 standard.

6. The semiconductor-encapsulating resin composition according to claim 1, further comprising:

a compound (C) having two or more phenolic hydroxyl groups other than the compound (B), wherein the compound (C) comprises at least one selected from a novolak-type phenolic resin, a phenol aralkyl resin having a phenylene structure, a naphthol aralkyl resin having a phenylene structure, a phenol aralkyl resin having a biphenylene structure, and a dicyclopentadiene-modified phenolic resin.

7. The semiconductor-encapsulating resin composition according to claim 1, wherein the compound (A) comprises at least one selected from a resin obtained by epoxidizing biphenol, a resin obtained by epoxidizing bisphenol F, a resin obtained by epoxidizing thiobisphenol, a resin obtained by epoxidizing a phenol aralkyl resin having a phenylene structure, a resin obtained by epoxidizing a naphthol aralkyl resin having a phenylene structure, a resin obtained by epoxidizing a phenol aralkyl resin having a biphenylene structure, a resin obtained by epoxidizing a novolak-type phenolic resin, a resin obtained by epoxidizing a dicyclopentadiene-modified phenolic resin, and a dihydroanthrahydroquinone glycidyletherified epoxy resin.

8. The semiconductor-encapsulating resin composition according to claim 1, further comprising a curing accelerator (D).

9. The semiconductor-encapsulating resin composition according to claim 8, wherein the curing accelerator (D) is at least one selected from a compound represented by general formula (2), a compound represented by general formula (3), a compound represented by general formula (4), and a compound represented by general formula (5)

(2)

wherein P is a phosphorus atom,
each of R3, R4, R5, and R6 is an aromatic group or an alkyl group, and R3, R4, R5, and R6 are same or different,
A is an anion of an aromatic organic acid in which at least one functional group selected from a hydroxyl group, a carboxyl group, and a thiol group is bonded to an aromatic ring,
AH is an aromatic organic acid in which at least one functional group selected from a hydroxyl group, a carboxyl group, and a thiol group is bonded to an aromatic ring,
each of a and b is an integer at least 1 and at most 3,
c is an integer at least 0 and at most 3, and
a =b, (3)

wherein P is a phosphorus atom,
X1 is an alkyl group having 1 to 3 carbon atoms,
Y1 is a hydroxyl group, and
each of d and e is an integer at least 0 and at most 3, (4)

wherein P is a phosphorus atom,
each of R7, R8, and R9 is an alkyl group having 1 to 12 carbon atoms or an aryl group having 6 to 12 carbon atoms, and R7, R8, and R9 are same or different,
each of R10, R11, and R12 is a hydrogen atom or an organic group having 1 to 12 carbon atoms, and R10, R11, and R12 are same or different, (5)

wherein A1 is a nitrogen atom or a phosphorus atom,
Si is a silicon atom,
each of R13, R14, R15, and R16 is an organic group having an aromatic ring or a heterocyclic ring or an aliphatic group, and R13, R14, R15, and R16 are same or different,
X2 is an organic group that bonds group Y2 to group Y3,
X3 is an organic group that bonds group Y4 to group Y5,
each of Y2 and Y3 is a group formed when a proton-donating substituent releases a proton, Y2 and Y3 are same or different, and group Y2 and group Y3 in same molecule are bonded to the silicon atom to form a chelate structure,
each of Y4 and Y5 is a group formed when a proton-donating substituent releases a proton, and the group Y4 and the group Y5 in same molecule are bonded to the silicon atom to form a chelate structure,
X2 and X3 are same or different, and Y2, Y3, Y4, and Y5 are same or different, and
Z1 is an organic group having an aromatic ring or a heterocyclic ring, or an aliphatic group.

10. The semiconductor-encapsulating resin composition according to claim 1, further comprising a silane coupling agent (E) and a compound (F) in which a hydroxyl group is bonded to each of two or more adjacent carbon atoms constituting an aromatic ring.

11. The semiconductor-encapsulating resin composition according to claim 10, wherein the compound (F) is a compound in which a hydroxyl group is bonded to each of two adjacent carbon atoms constituting an aromatic ring.

12. The semiconductor-encapsulating resin composition according to claim 10, wherein the compound (F) is a compound in which a hydroxyl group is bonded to each of two or more adjacent carbon atoms constituting a naphthalene ring.

13. The semiconductor-encapsulating resin composition according to claim 10, wherein the compound (F) is a compound in which a hydroxyl group is bonded to each of two adjacent carbon atoms constituting a naphthalene ring.

14. The semiconductor-encapsulating resin composition according to claim 10, wherein the amount of compound (F) is at least about 0.01 weight percent and at most about 1 weight percent of the total weight of the resin composition.

15. The semiconductor-encapsulating resin composition according to claim 10, wherein an amount of silane coupling agent (E) is at least about 0.01 weight percent and at most about 1 weight percent of the total weight of the resin composition.

16. The semiconductor-encapsulating resin composition according to claim 1, further comprising an inorganic filler (G) in an amount at least about 80 weight percent and at most about 92 weight percent of the total weight of the resin composition.

17. A semiconductor device produced by encapsulating a semiconductor element with a cured product of a semiconductor-encapsulating resin composition, the resin composition comprising:
a compound (A) having two or more glycidyl ether groups; and
a compound (B) represented by general formula (6)

(6)

wherein —$Ar_1$— is a group selected from a phenylene group, a 1-naphthylene group, a 2-naphthylene group, an oxybiphenylene group, and a biphenylene group;
—$Ar_2$— is a group selected from a phenylene group, a biphenylene group, and a naphthylene group;
however, the case where both —$Ar_1$— and —$Ar_2$— are phenylene groups is eliminated;
X is a hydrogen atom or an organic group that has 1 to 20 carbon atoms and that may have a hydroxyl group,
each of substituents R1 introduced in —$Ar_1$— is an organic group having 1 to 20 carbon atoms, and substituents R1 may be the same or different;
each of substituents R2 introduced in —$Ar_2$— is an alkyl group having 1 to 4 carbon atoms, and substituents R2 may be the same or different;

k is an integer in the range of 0 to 7;
l is an integer in the range of 0 to 8; and
each of the averages of p and q is a positive number more than 0 and less than 10.

18. A semiconductor-encapsulating resin composition comprising;
a compound (A) having two or more glycidyl ether groups; and
a compound (B) represented by general formula (1)

(1)

wherein —$Ar_1$— is at least one group selected from a substituted or unsubstituted phenylene group, a 1-naphthylene group, a 2-naphthylene group, an oxybiphenylene group, and a biphenylene group,
—$Ar_1$— is at least one group selected from a phenylene group, a biphenylene group, and a naphthylene group,
X is an organic group that has 1 to 20 carbon atoms and a hydroxyl group,
each of substituents R1 introduced in —$Ar_1$— is an organic group having 1 to 20 carbon atoms, and substituents R1 are same or different,
each of substituents R2 introduced in —$Ar_2$— is an alkyl group having 1 to 4 carbon atoms, and substituents R2 are same or different,
k is an integer at least 0 and at most 7,
l is an integer at least 0 and at most 8, and
an average of m and n is a positive number more than 0 and less than 10.

19. The semiconductor-encapsulating resin composition according to claim 18, wherein a ratio of an area of a component in which m≠0 and n≠0 in formula (1) to a total area of the compound (B) in a GPC chart is about 5% or more and about 55% or less, and a ratio of an area of a component in which m=0 and n=0 in formula (1) to the total area of the compound (B) in the GPC chart is about 0.1% or more and about 40% or less.

* * * * *